Dec. 1, 1970 J. A. McDONALD ET AL 3,544,811
LOCK-ON PREVENTION IN TRANSISTOR DEFLECTION CIRCUITS
Original Filed May 14, 1965
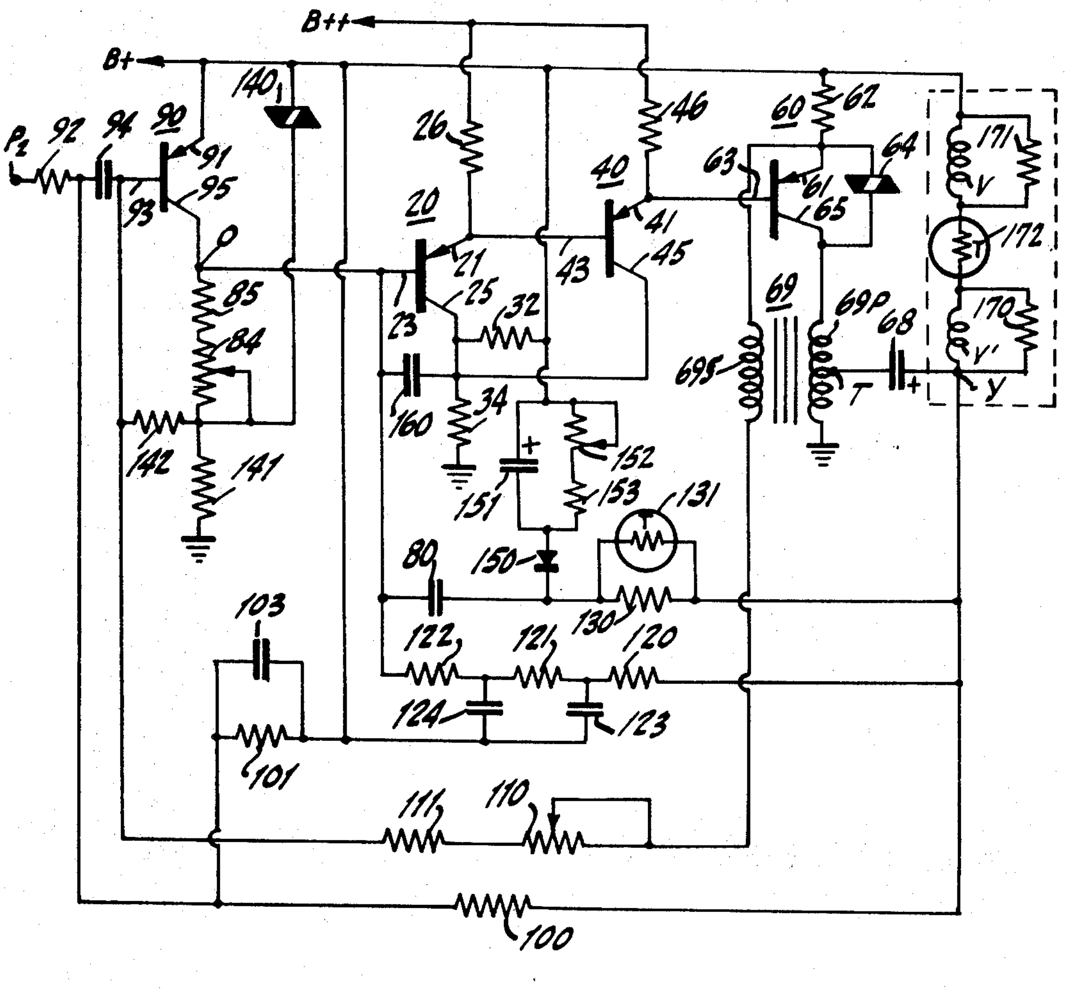
INVENTORS
JAMES A. McDONALD &
TODD J. CHRISTOPHER
BY William H. Meagher
Attorney United States Patent Office 3,544,811

Patented Dec. 1, 1970

3,544,811
LOCK-ON PREVENTION IN TRANSISTOR DEFLECTION CIRCUITS

James A. McDonald and Todd J. Christopher, Indianapolis, Ind., assignors to RCA Corporation, a corporation of Delaware Application June 6, 1968, Ser. No. 739,938, now Patent No. 3,488,553, dated Jan. 6, 1970, which is a continuation of application Ser. No. 455,682, May 14, 1965. Divided and this application Jan. 27, 1969, Ser. No. 794,151

Int. Cl. H03k 4/56

U.S. Cl. 307—228 3 Claims

ABSTRACT OF THE DISCLOSURE

Deflection circuit involves sawtooth waveform generation across a capacitor in a negative feedback path looped around a high gain transistor amplifier. Capacitor is subject to alternate charging and discharging as a switching transistor, connected to the amplifier input terminal, is altered between conducting and nonconducting states; switching between these two states occurs on a recurrent, oscillatory basis, the switching transistor cooperating with the output stage of the transistor amplifier in the fashion of an astable multivibrator. To preclude output stage, on turn-on of the receiver, from locking on in saturation and preventing desired multivibrator action, a low-valued resistor is provided in the emitter circuit of the output stage, and a direct current conductive feedback path is provided between said emitter circuit and the input electrode of the switching transistor.

The present invention relates generally to transistor deflection circuits, and particularly to arrangements for precluding spurious modes of operation in such circuits.

This application is a division of application Ser. No. 739,938, filed June 6, 1968, now Pat. No. 3,488,553, which, in turn, is a continuation of application Ser. No. 455,682, now abandoned, filed May 14, 1965.

In a copending patent application of John B. Beck and Roland N. Rhodes, Ser. No. 455,736, now Pat. No. 3,502,935, entitled "Transistor Deflection Circuits" and filed concurrently with the parent application, Ser. No. 455,682, the application of the principles of the so-called "Miller Integrator" to transistor deflection circuits is discussed in detail, and resultant deflection circuits of an advantageous character for serving the vertical deflection function in a television receiver are disclosed. In such circuits, the receiver's vertical yoke winding is traversed by a desired current waveform in response to sawtooth voltage waveform generation across a capacitor in a negative feedback path looped around a high current gain transistor amplifier. The capacitor is subject to alternate charging and discharging in an operating cycle recurring at the (60 c.p.s.) television field rate as a switching transistor, connected to the amplifier input terminal, is altered between conducting and nonconducting states. In a particularly advantageous arrangement, regenerative feedback is provided between the output of the transistor amplifier and the input of the switching transistor so that switching of the latter between conducting and nonconducting states may occur on a recurrent, oscillatory basis (the switching transistor cooperating with the output stage of the transistor amplifier in the fashion of an astable multivibrator).

A potential drawback to receiver use of a transistor deflection circuit of the above-described type is the possibility, upon turn-on of the receiver, of the output stage of the transistor amplifier locking on in saturation and thereby preventing the desired multivibrator action.

In accordance with the present invention, in expensive means are incorporated in a deflection circuit of the above-described type to ensure proper starting action upon turn-on of the receiver, with said means not otherwise interfering with the circuit operation once proper starting action has occurred. Pursuant to a particular embodiment of the invention, such means are realized by providing a low-valued resistor in the emitter circuit of a common-emitter output stage, and establishing a direct current conductive feedback path between said emitter circuit and the input electrode of the switching transistor.

A primary object of the present invention is to provide novel and improved transistor deflection circuits.

A further object of the present invention is to provide a transistor deflection circuit with apparatus for precluding a spurious mode of circuit operation.

Other objects and advantages of the present invention will be recognized by those skilled in the art after a reading of the following detailed description and an inspection of the accompanying drawing in which a television receiver vertical deflection circuit embodying the principles of the present invention is illustrated in schematic detail.

Before describing the specific problem solution provided by the circuit features of the present invention, a general description of the operation of the deflection circuit of the drawing is in order.

In the vertical deflection arrangement of the drawing, a sawtooth current waveform is caused to pass through the vertical deflection windings V and V′ of the deflection yoke, the windings V and V′ being connected in series between the receiver's source of unidirectional potential (B+) and the yoke input terminal Y. The flow of the desired sawtooth current waveform in the windings, which appear essentially resistive, is in response to the development of a sawtooth voltage waveform at terminal Y. The development of this sawtooth voltage waveform is effected through use of a transistorized arrangement employing the principles of the "Miller Integrator."

Transistors 20, 40 and 60 are cascaded to form a high current gain amplifier. Negative feedback is established between the amplifier output and the amplifier input via a path incorporating a capacitor 80. Capacitor 80 is subject to alternate charging and discharging, per switching action of transistor 90. The amplifier output voltage waveform (at terminal Y) is a substantially linear sawtooth voltage waveform per "Miller Integrator" principles.

When transistor 90 is conducting, it shorts the feedback amplifier input terminal O (at the base of transistor 20) to the B+ potential source; when transistor 90 is nonconducting, terminal O sees the transistor 90 stage as an open circuit. Switching of transistor 90 between these two states occurs on a recurrent, oscillatory basis, transistor 90 cooperating with the output transistor 60 in the fashion of an astable multivibrator.

Multivibrator action is sustained by the coupling of the output electrode (collector 95) of transistor 90 to the input electrode (base 63) of transistor 60 via transistors 20 and 40, and the coupling of the output electrode (collector 65) of transistor 60 to the input electrode (base 93) of transistor 90 via a feedback resistor 100. Synchronization of the multivibrator action is effected through the application of synchronizing pulses from terminal $P_2$ to base 93 via a resistor 92 in series with a capacitor 94. The feedback resistor 100 is connected between the yoke input terminal Y and the junction of resistor 92 and capacitor 94. A parallel RC network comprising resistor 101, shunted by capacitor 103, is coupled between the aforesaid junction and the B+ source, and serves a pulse shaping function, partially integrating the vertical flyback pulses fed back from terminal Y, and discriminating against the undesired feedback of horizontal frequency pulses, which may undesirably be induced in the vertical yoke windings via coupling from the horizontal yoke windings.

Transistor 20 is arranged in an emitter follower configuration, its emitter electrode 21 being connected via an emitter resistor 26 to the receiver's B++ terminal. Transistor 40 provides a second emitter follower stage, appearing as an emitter load of the transistor 20 emitter follower, the base electrode 43 of transistor 40 being directly connected to emitter electrode 21, and the emitter electrode 41 of transistor 40 being connected via an emitter resistor 46 to the B++ terminal. The collector electrodes 25 and 45 of the two emitter follower stages are jointly connected to an appropriate division point on a low impedance voltage divider connected between B+ and chassis ground; the voltage divider comprises the series combination of resistors 32 and 34, with the collector electrodes connected to the junction of the series resistors.

The output of the cascaded emitter follower stages is applied to the base electrode 63 of output transistor 60, base 63 being directly connected to emitter 41. The emitter 61 of transistor 60 is connected via resistor 62 (to be subsequently discussed) to the B+ terminal. A direct current conductive path between the collector electrode 65 of transistor 60 and chassis ground is provided through a transformer primary winding 69P. An alternating current signal path is also provided between the collector 65 and the emitter 61, this path comprising, in series, a portion of winding 69P, a DC blocking capacitor 68 and the vertical yoke windings V, V'. The aforementioned yoke input terminal Y appears at the junction of blocking capacitor 68 and the yoke winding V'.

Feedback between terminal Y and the base input of transistor 20 is provided via a path comprising resistor 130 (shunted by thermistor 131, for purposes to be described subsequently) in series with the capacitor 80. A variable resistor 84 (in series with fixed resistors 85 and 141, serving a function to be subsequently described) connects the base 23 to chassis ground. The nature of the feedback provided via capacitor 80 is negative, since the emitter follower stages 20 and 40 produce no signal phase reversal, whereby only a single phase reversal (i.e., that contributed by stage 60) is provided within the feedback loop.

To appreciate the mode of operation of the apparatus heretofore recited, it may be convenient to first consider the operation assuming the omission of emitter follower stages 20 and 40, i.e., whereby terminal O would be directly connected to the base 63 of output transistor. When transistor 90 is nonconducting, transistor 60 is biased for conduction and a charging circuit for capacitor 80 is established between B+ and chassis ground, the circuit comprising the series combination of the conducting output transistor 60, a portion of winding 69P, blocking condenser 68, the parallel R-network 130–131, capacitor 80, resistor 85, variable resistor 84, and resistor 141. Assuming resistor 84 to be large in resistance value relative to the resistance values of resistors 85, 130, 131 and 141, resistor 84 will be primarily determinative of the charging rate (and may, accordingly, conveniently serve as a manual height control). The negative feedback action tends to oppose changes in the potential at terminal O during the charging period; the current through resistor 84 is accordingly relatively constant. A capacitor charging current of such relatively constant character assures a high degree of linearity of the resultant sawtooth voltage. The charging time constant is effectively considerably larger than that suggested by the physical values of capacitor 80 and resistor 84 due to the dynamic action of the amplifier which multiplies the effective capacitance by a factor dependent upon the amplifier gain.

When transistor 90 is conducting, transistor 60 is driven to cut-off and a discharging circuit for capacitor 80 is completed comprising, in series, the conducting transistor 90, capacitor 80, resistive network 130–131, and the yoke windings V, V'. Network 130–131 is primarily determinative of the discharging rate; with a resistance value for the parallel R-network appropriately smaller than that of resistor 84, per the previous assumption, the discharging time constant is much shorter than the charging time constant.

From the foregoing simplified description, it can be seen that the effect of the periodic switching of transistor 90 between conducting and nonconducting states is to develop across capacitor 80 (i.e., at terminal Y with respect to chassis ground) a substantially linear sawtooth voltage waveform, resulting in the desired sawtooth current waveform flowing through the effectively resistive yoke windings V, V'.

However, it should be appreciated that for the above-described type of operation to take place, it is essential that the transistor amplifier present a very high input impedance to terminal O. As a practical matter, while special transistors such as those of the so-called MOS type may inherently present high input impedances, the conventional transistor is a relatively low input impedance device. Thus, if transistors 60 were a conventional transistor and were relied upon as the sole amplifying device within the feedback loop, its relatively low input impedance would deteriorate the capacitor charging action desired. However, by interposing the transistor emitter follower stages between terminal O and the base input of transistor 60, this problem is solved. That is, terminal O now sees very high input impedance; i.e., the input impedance of an emitter follower, incorporating in its emitter load a further emitter follower, which in turn incorporates in its emitter load the input impedance of transistor 60. The net input impedance presented by this combination is sufficiently large to permit the desired charging action.

The emitter follower stages also serve to contribute current gain within the negative feedback loop, whereby a high current gain amplifier is realized. The capacitance multiplying effect of the arrangement is thereby enhanced. Through reliance on this capacitance multiplying effect, problems of instability and/or expense associated with the use of large-valued electrolytic capacitors as the sawtooth capacitor may be avoided. The effect of a large valued capacitor may be obtained, though the actual capacitor used as capacitor 80 may be a relatively small, stable and inexpensive capacitor of the paper type (of a .1 microfarad value, for example).

With the foregoing general description of desired operation in mind, it is now appropriate to consider certain spurious modes of operation to which the heretofore described circuitry may be subject, and to consider the solutions provided in the illustrated circuit.

First, it may be noted that the above-described form of deflection circuit may have a tendency to sustain oscillations at a 30 cycle rate as well as the desired 60 cycle field rate. This may be traced to the fact that the charge on the capacitor 80 at the beginning of trace is responsive to the peak amplitude of the retrace pulse developed at terminal Y, with the latter in turn dependent upon the sawtooth amplitude during the previous trace interval. If such subharmonic oscillation is not precluded, successive sawtooth voltage waves may be displaced in amplitude relative to each other (effectively "riding" up and down on a 30 cycle wave) causing a disturbing "jitter" of the display raster.

Herein, such "jitter" is precluded through use of a clamp circuit utilizing diode 150. Diode 150 has its cathode electrode directly connected to the junction of sawtooth capacitor 80 and discharge resistor 130; the anode electrode of diode 150 is coupled by means of an RC network to the B+ potential source. The RC network includes a large-valued capacitor 151 shunted by the series combination of a variable resistor 152 and a fixed resistor 153.

Diode 150 is poled to conduct during retrace pulse peaks, tending to clamp said peaks to a reference potential built up across capacitor 151. The time constant of the RC network incorporating capacitor 151 is sufficiently long to assure (once the initial buildup is completed) that the clamping action will effectively remove the undesired 30 cycle modulation components. However, the reference clamping potential is purposely not a fixed voltage, but rather is on a long term basis responsive to changes in retrace pulse peak potential to assure tracking with long term or DC variations that are reflected in other deflection parameter changes.

Variable resistor 152 provides a manual control of the clamping potential, and can thus serve as a linearity control. Its effects, however, are substantially confined to the top quarter of the picture, corresponding to the deflection cycle portion during which transistion into full Miller operation takes place.

Another spurious operating mode which must be reckoned with stems from the association of a multiplicity of feedback paths with high gain amplifier devices. Various undesired loops can exist in such apparatus which are capable of sustaining oscillations at very high frequencies (e.g., several megacycles). To suppress such oscillations capacitor 160 is provided in the illustrated circuit, connected between the joined collectors of stages 20 and 40 and the base 23 of transistor 20. While the resistors 32 and 34 in the common collector circuit of these stages do not constitute a significant load at desired frequencies of operation, they can constitute a noticeable load at the undesired high frequencies. Negative feedback from such load via the capacitor provides sufficient degeneration at the high frequencies to preclude the sustaining of the undesired oscillations. It has been found that the particular location noted for effecting the degeneration is optimum, since it allows use of a relatively small, inexpensive capacitor (e.g., disc type) for the purpose. Other degeneration approaches were found to require the use of larger, more expensive capacitors. Such advantage of the noted location is believed to be related to the dual functioning of the capacitor in the noted location; i.e., the single capacitor degenerates two gain devices in cascade, effectively providing two degenerative loops for the price of one. This circuit feature forms the subject matter of our copending application entitled "Spurious Oscillation Suppression in Transistor Deflection Circuit," Ser. No. 794,150, filed concurrently herewith.

The present invention is concerned with means for precluding transistor 60 from locking on in saturation and preventing desired multivibrator action. Such condition might be encountered on turn-on of the receiver, if not otherwise prevented. Such prevention is ensured herein by inclusion of a low-valued (e.g., less than one ohm) resistor 62 in the emitter circuit of output transistor 60. In normal operation, such value is so low that the resistor has no significant effect. However, should transistor 60 approach saturation, the current sample represented by the voltage across resistor 62 becomes significant. This sample is fed to the base of transistor 90 via a feedback path including winding 69S, hold control 110 and reistor 111, in series, and causes desired initiation of multivibrator action.

The noted feedback path involving winding 69S serves to enhance accuracy of timing synchronization, as described in more detail in a copending application Ser. No. 455,730, now Pat. No. 3,428,855, of James A. McDonald, entitled "Transistor Deflection Control Arrangements" and filled concurrently with the aforementioned parent application, Ser. No. 455,682. Reference may also be made to said McDonald application for an explanation of the functioning of the feedback network

120, 121, et al., which provides so-called S-shaping of the deflection current.

In another copending McDonald application, Ser. No. 455,685, now Pat. No. 3,528,854, entitled "Temperature Compensation of Deflection Circuits" and filed concurrently with the aforementioned parent application, Ser. No. 455,682, explanation is given of the functioning of thermistor 131 in precluding adverse temperature effects on deflection linearity, and the thermal stability purpose of the B++ return of the emitter resistors of stages 20 and 40.

In an additional copending application, Ser. No. 455,748, now U.S. Pat. No. 3,388,285, of Todd J. Christopher and James A. McDonald, entitled "Size Stabilization," and filed concurrently with the aforementioned parent application Ser. No. 455,682, an explanation is provided of the functioning of VDR 140 and resistors 141 and 142 in stabilizing deflection parameters against line voltage changes.

By way of example, a set of values for the circuit parameters of the drawing, which values have proved satisfactory in operation, is presented in connection with FIG. 2 of the previously mentioned copending Beck and Rhodes application, and reference may be made thereto for such illustrative information.

What is claimed is:

1. In a transistor deflection circuit, the combination of:

a first resistor subject to periodic switching between a conductive and a nonconductive state, and having base, emitter and collector electrodes;

means for connecting said emitter electrode of said first transistor to a source of unidirectional potential;

a resistor;

an amplifier having an input terminal and an output terminal, said amplifier including a second transistor having an emitter electrode connected via said resistor to said source of unidirectional potential, and having a collector electrode coupled to said output terminal;

means for establishing a negative feedback path between said output terminal and said input terminal of said amplifier, said feedback path including a capacitor;

means for connecting the collector electrode of said first transistor to said amplifier input terminal;

resistive means for connecting said amplifier input terminal to a point of reference potential;

and means establishing a second feedback path between the emitter electrode of said second transistor and the base electrode of said first transistor for precluding lock-on of said second transistor, the resistance value of said resistor being sufficiently low as to render feedback from said second transistor emitter electrode ineffective in controlling operation of said first transistor under normal operating conditions.

2. In a transistor deflection circuit, the combination of:

a first transistor having base, emitter and collector electrodes, and subject to periodic switching between a conductive and a nonconductive state in response to an input applied between said base and emitter electrodes;

a resistor;

an amplifier having an input terminal and an output terminal, said amplifier including a second transistor having an emitter electrode connected via said resistor to a point of relatively fixed potential, and having a collector electrode coupled to said output terminal;

means for establishing a negative feedback path between said output terminal and said input terminal of said amplifier, said feedback path including a capacitor;

means for connecting the collector electrode of said first transistor to said amplifier input terminal;

and means establishing a second feedback path between the emitter electrode of said second transistor and the base electrode of said first transistor for precluding lock-on of said second transistor, said second feedback path being direct current conductive, the resistance value of said resistor being sufficiently low as to render feedback from said second transistor emitter electrode ineffective in controlling operation of said first transistor under normal operating conditions.

3. In a transistor deflection circuit, the combination of:

a first transistor having input common and output electrodes, and subject to periodic switching between a conductive and a nonconductive state in response to an input applied between said input and common electrodes;

a resistor;

a phase inverting amplifier having an input terminal and an output terminal, said amplifier including a second transistor having an input electrode coupled to respond to voltage variations at said input terminal, a common electrode connected via resistor to a point of relatively fixed potential, and an output electrode coupled to said output terminal;

means for establishing a first feedback path between said output terminal and said input terminal of said amplifier, said feedback path providing negative feedback and including a capacitor;

means including a connection between the output electrode of said first transistor and said amplifier input terminal for permitting charging of said capacitor when said first transistor is nonconductive and for effecting discharge of said capacitor when said first transitsor is conductive;

means for establishing a second feedback path between said output electrode of said second transistor and the input electrode of said first transistor, said second feedback path providing regenerative feedback and including a second capacitor;

and means establishing a third feedback path between the common electrode of said second transistor and the input electrode of said first transistor for precluding lock-on of said second transistor, said third feedback path being direct current conductive, the resistance value of said resistor being sufficiently low as to render feedback from said second transistor common electrode ineffective in controlling operation of said first transistor under normal operating conditions.

References Cited

UNITED STATES PATENTS

| | | | |
|---|---|---|---|
| 2,964,673 | 12/1960 | Stanley | 315—26 |
| 3,229,151 | 1/1966 | Attwood | 315—27 |

STANLEY D. MILLER, Jr., Primary Examiner

U.S. Cl. X.R.

315—27; 328—128, 181

UNITED STATES PATENT OFFICE

CERTIFICATE OF CORRECTION

Patent No. 3,544,811 Dated December 1, 1970

Inventor(s) James A. McDonald & Todd J. Christopher

It is certified that error appears in the above-identified patent and that said Letters Patent are hereby corrected as shown below:

Column 6, line 4, that portion reading "3,528,854" should read --3,428,854--.

SIGNED AND SEALED FEB 9 1971

FEB. 9,1971

(SEAL)
Attest:

Edward M. Fletcher, Jr.
Attesting Officer

WILLIAM E. SCHUYLER, J
Commissioner of Paten